(12) United States Patent
Hu

(10) Patent No.: US 8,659,064 B2
(45) Date of Patent: Feb. 25, 2014

(54) SEMICONDUCTOR BARRIER LAYER CONSTRUCTIONS, AND METHODS OF FORMING SEMICONDUCTOR BARRIER LAYER CONSTRUCTIONS

(75) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 13/185,872

(22) Filed: Jul. 19, 2011

(65) Prior Publication Data

US 2012/0012914 A1    Jan. 19, 2012

Related U.S. Application Data

(62) Division of application No. 11/167,011, filed on Jun. 24, 2005, now Pat. No. 7,999,330.

(51) Int. Cl.
*H01L 29/94* (2006.01)

(52) U.S. Cl.
USPC ........ 257/301; 257/300; 257/E27.09; 438/239

(58) Field of Classification Search
CPC ............................... H01L 28/75; H01L 28/85
USPC ................... 257/301, 303, 306, E27.09, 300; 438/239
See application file for complete search history.

(56) References Cited

U.S. PATENT DOCUMENTS

| | | | |
|---|---|---|---|
| 4,546,373 A * | 10/1985 | Todd et al. | 257/198 |
| 5,573,979 A | 11/1996 | Tsu et al. | |
| 5,622,886 A * | 4/1997 | Allum et al. | 438/238 |
| 6,309,969 B1 | 10/2001 | Oskam et al. | |
| 6,339,020 B1 | 1/2002 | Weihs et al. | |
| 6,500,761 B1 | 12/2002 | Wajda et al. | |
| 6,593,616 B2 | 7/2003 | Pan et al. | |
| 6,846,711 B2 * | 1/2005 | Yamasaki et al. | 438/240 |
| 7,001,848 B1 | 2/2006 | Smith et al. | |
| 2001/0013637 A1 | 8/2001 | Zhang et al. | |
| 2001/0020713 A1 | 9/2001 | Yoshitomi et al. | |
| 2002/0096737 A1 | 7/2002 | Nakamura et al. | |
| 2002/0102791 A1 | 8/2002 | Kurasawa et al. | |
| 2003/0077874 A1 | 4/2003 | Hsu et al. | |
| 2004/0188748 A1 | 9/2004 | Matsuhashi | |
| 2004/0192021 A1 | 9/2004 | Li | |
| 2004/0217440 A1 * | 11/2004 | Ng et al. | 257/528 |
| 2005/0003654 A1 | 1/2005 | Horikoshi et al. | |
| 2006/0063375 A1 | 3/2006 | Sun et al. | |
| 2006/0292785 A1 | 12/2006 | Chang et al. | |

OTHER PUBLICATIONS

Chih-Tang, Fundamentals of Solid State Electronics, 1991, Worls Scientific Publishing Comp Pte. Ltd., p. 1 and p. 282.*
Chih-Tang, Fundamentals of Solid State Electronics, 1991, Worts Scientific Publishing Company Pte. Ltd., p. 1 and p. 282.
Kuppusami et al., "Microstructure and Mechanical Properties of Ir-Ta Coatings on Nickel-Base Single-Crystal Superalloy TMS-75", J. Vac. Scl Technol. A 22(4), Jul./Aug. 2004, pp. 1208-1217.

(Continued)

*Primary Examiner* — Jerome Jackson, Jr.
*Assistant Examiner* — Paul Budd
(74) *Attorney, Agent, or Firm* — Wells St. John P.S.

(57) ABSTRACT

The invention includes methods of utilizing compositions containing iridium and tantalum in semiconductor constructions, and includes semiconductor constructions comprising compositions containing iridium and tantalum. The compositions containing iridium and tantalum can be utilized as barrier materials, and in some aspects can be utilized as barriers to copper diffusion.

18 Claims, 16 Drawing Sheets

(56) References Cited

OTHER PUBLICATIONS

S.M. Sze. Physics of Semiconductor Devices, 1981, John Wiley & Sons, vol. 2, pp. 20-22.

Wang, "Barriers Against Copper Diffusion into Silicon and Drift Through Silicon Dioxide", MRS Bulletin, 1994, pp. 30-40.

* cited by examiner

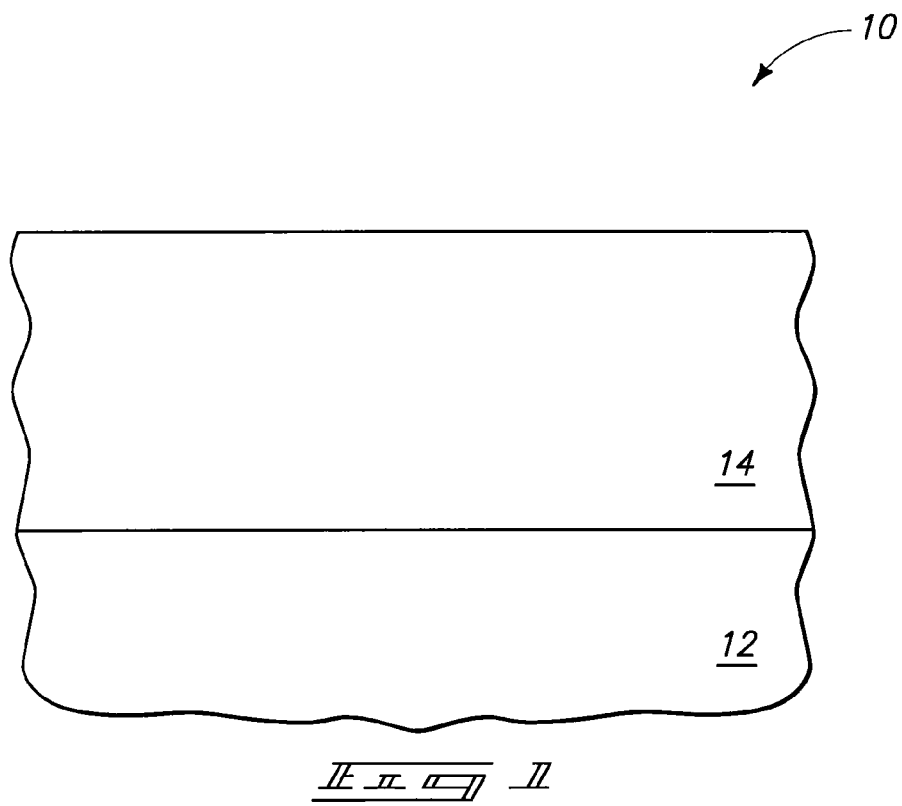
$\mathbb{F}ig1$
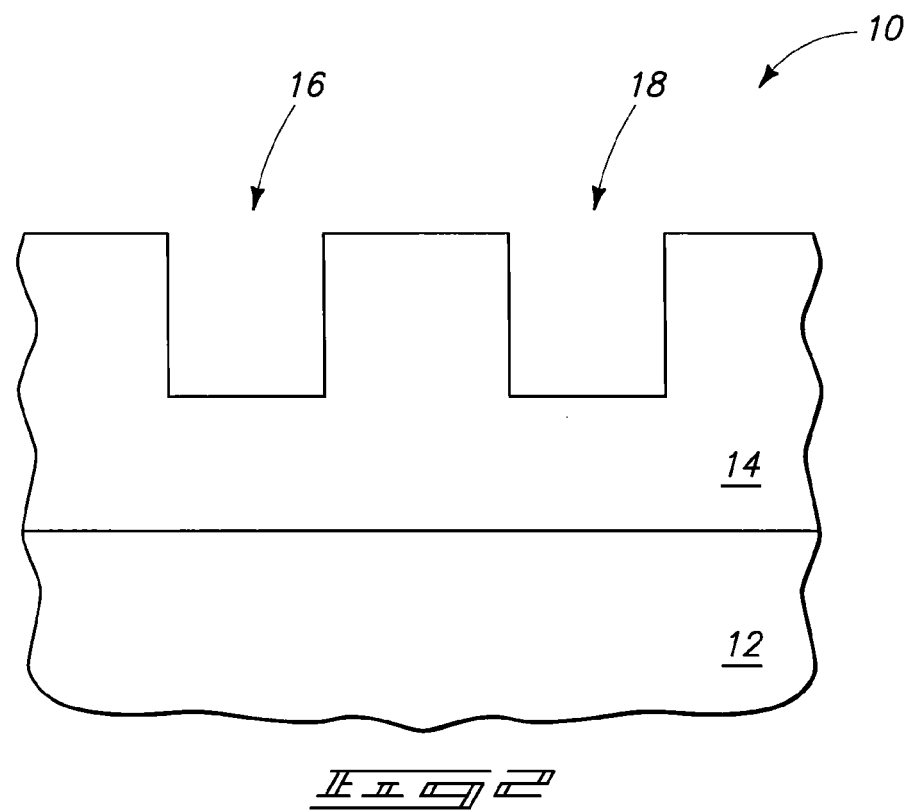
$\mathbb{F}ig2$

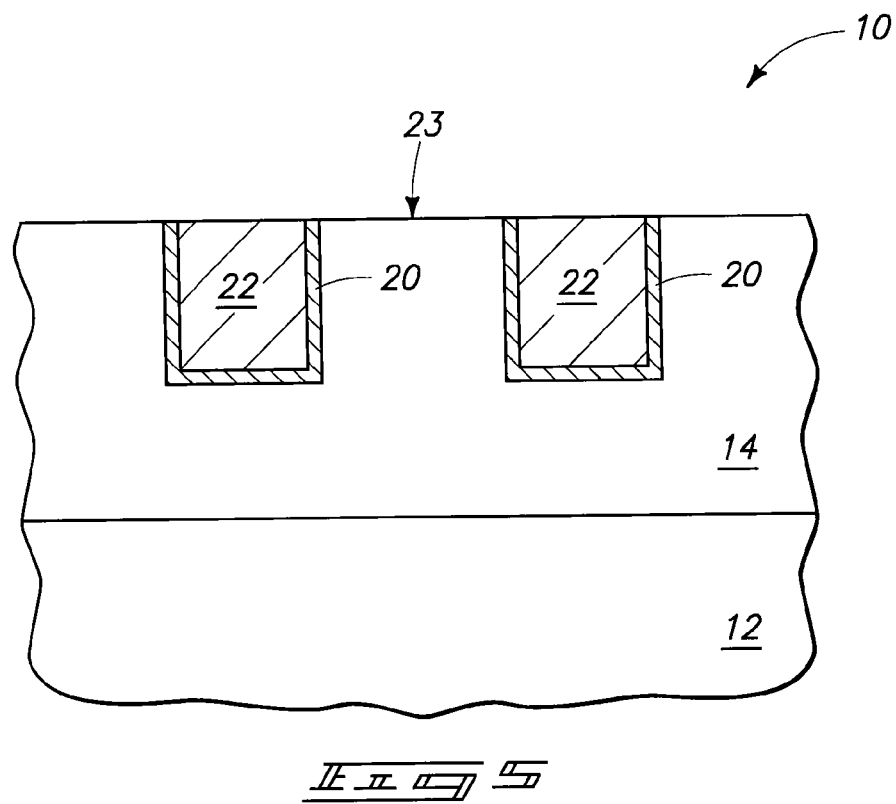
_Fig. 5_
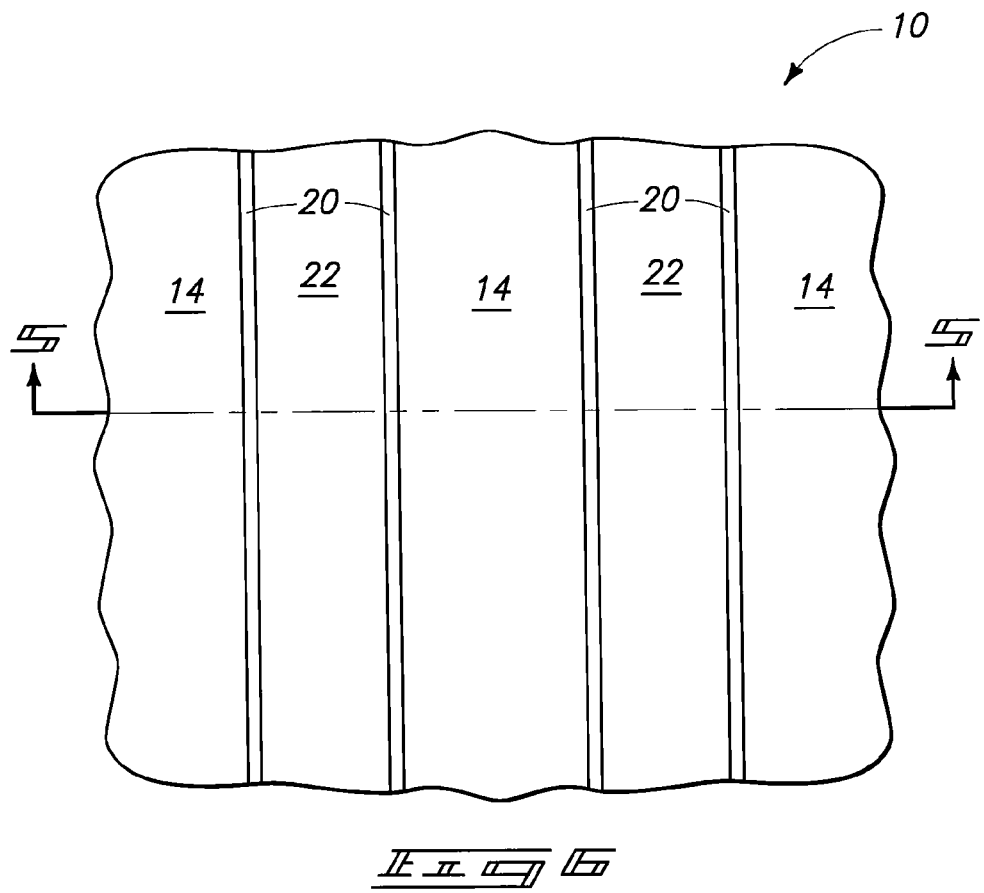
_Fig. 6_

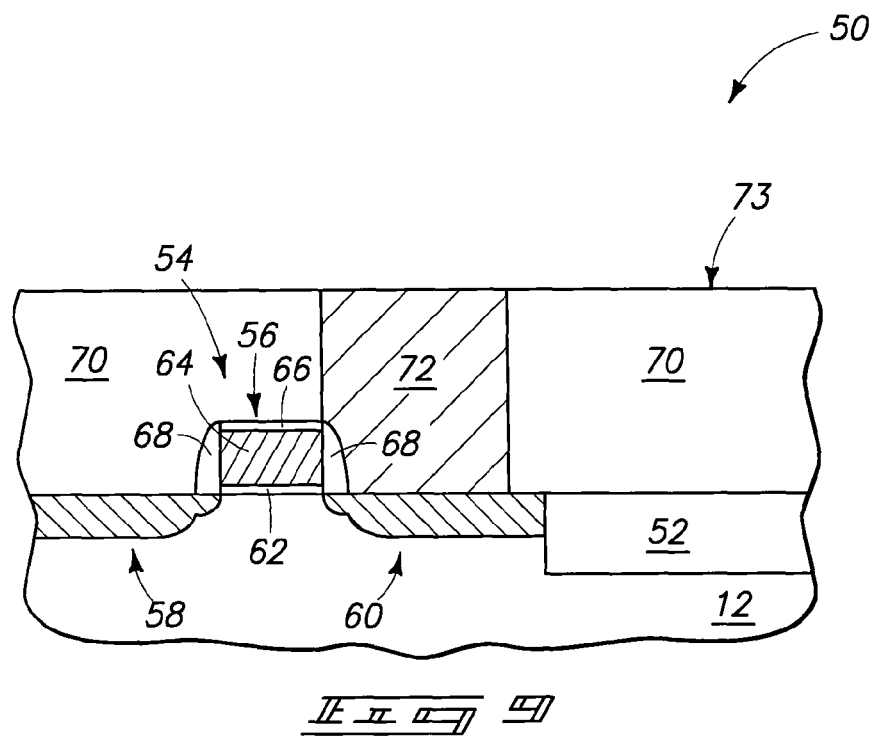
_Fig 9_
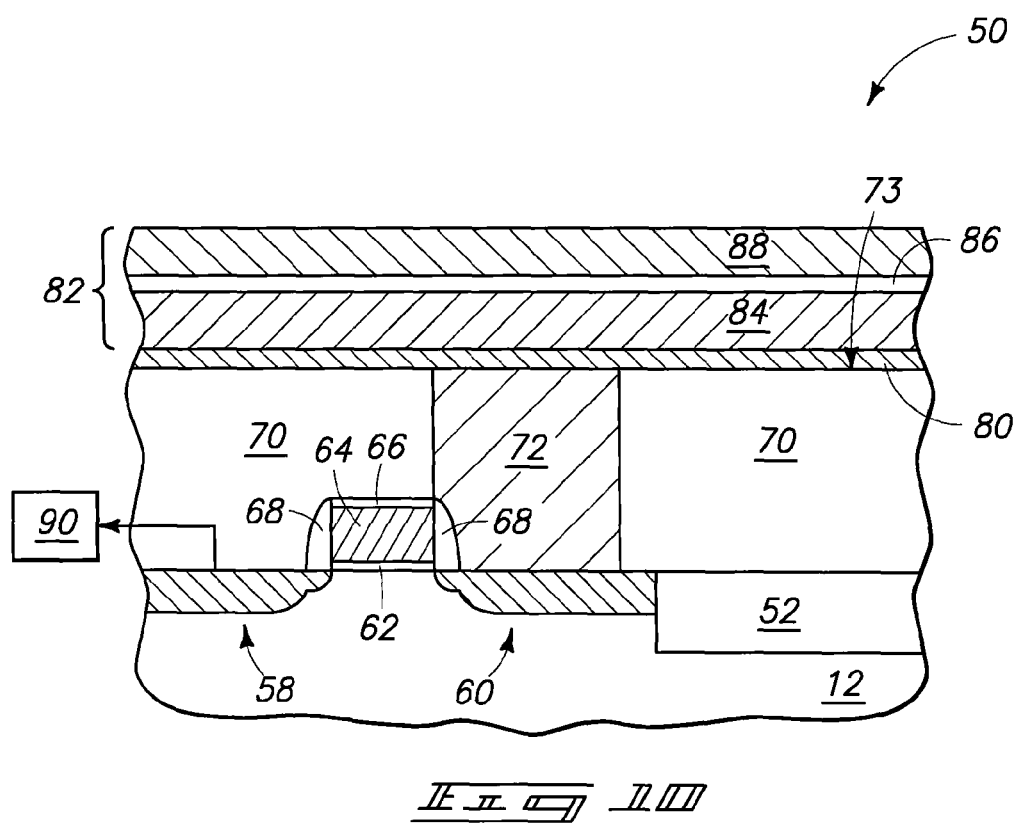
_Fig 10_

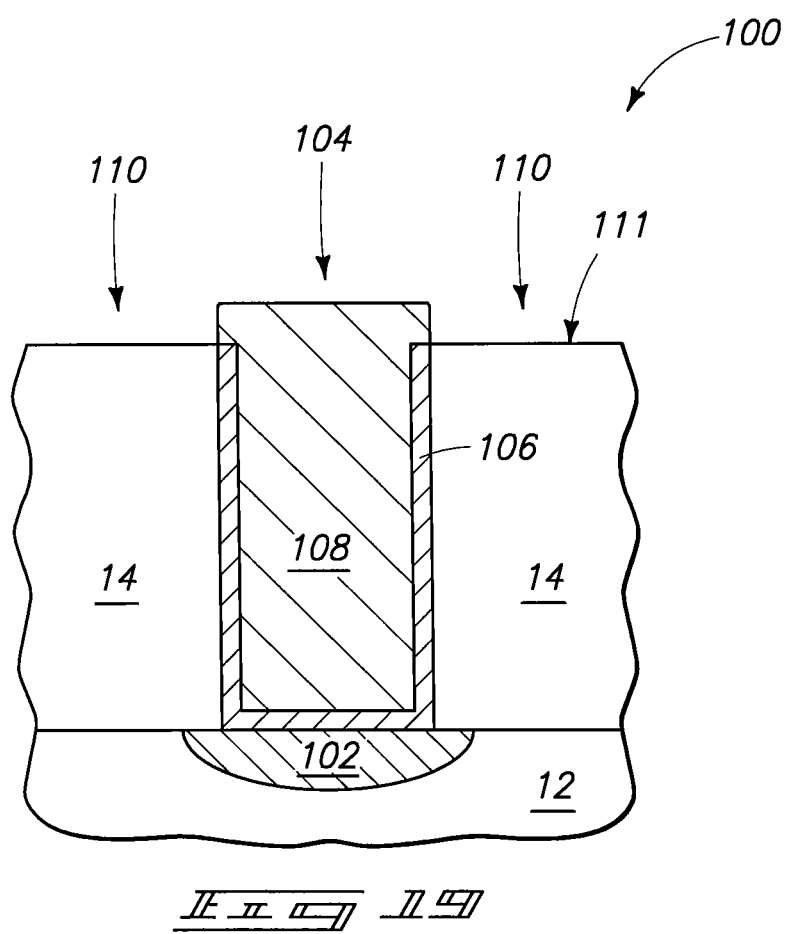
F I G   19

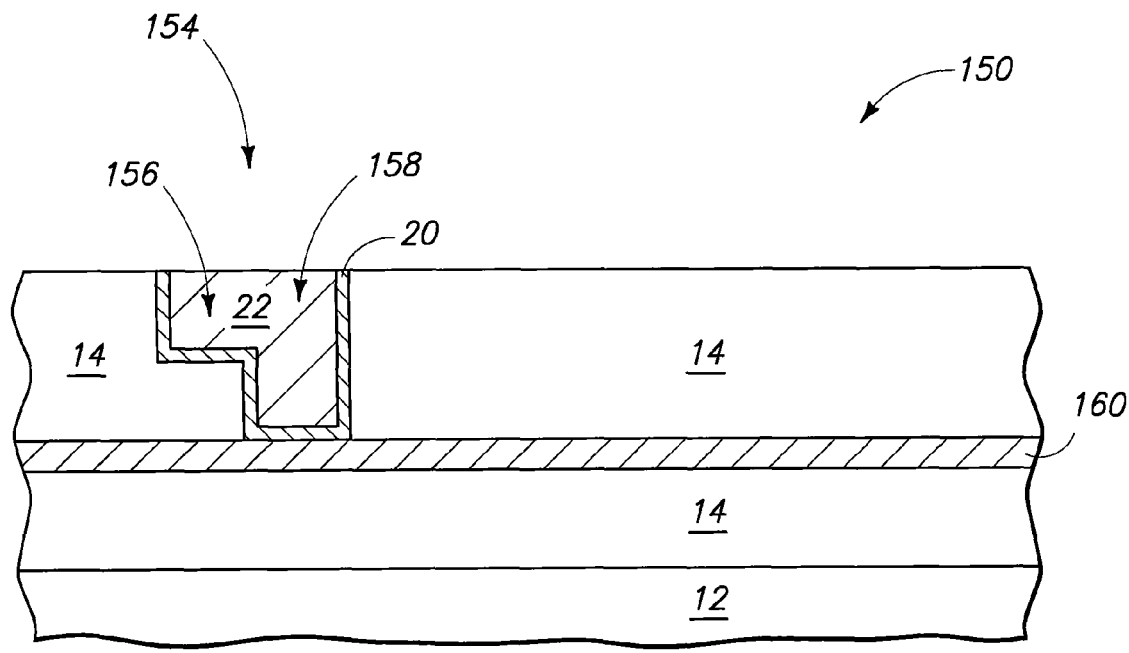
_Fig 22_
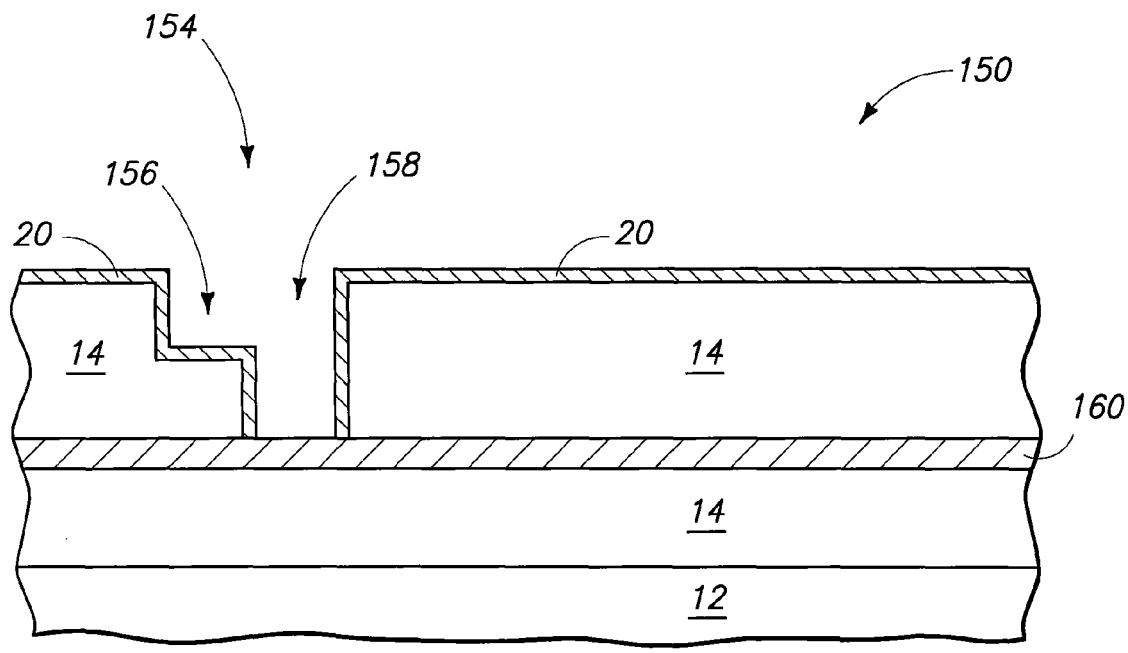
_Fig 23_

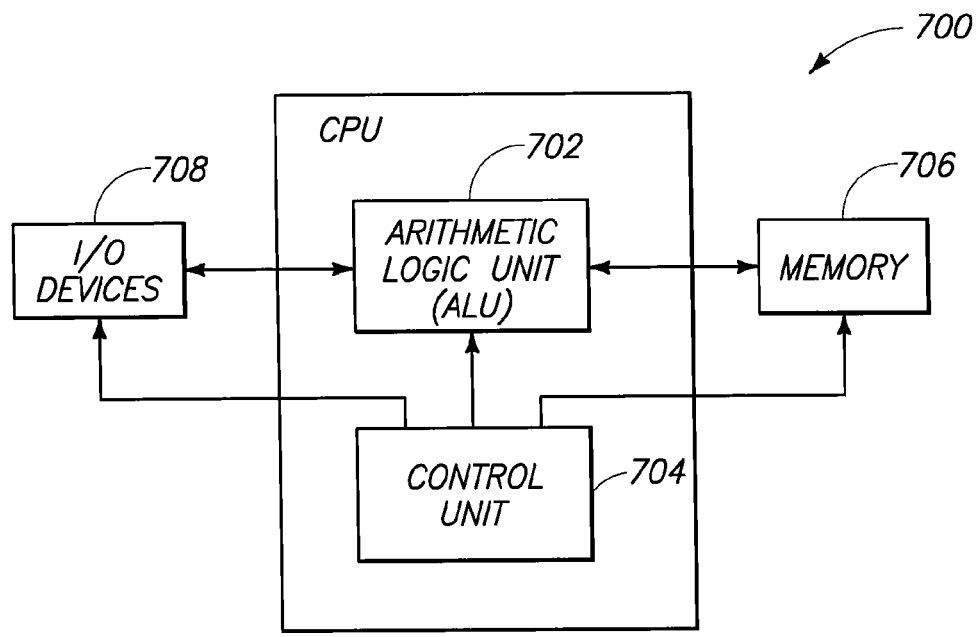
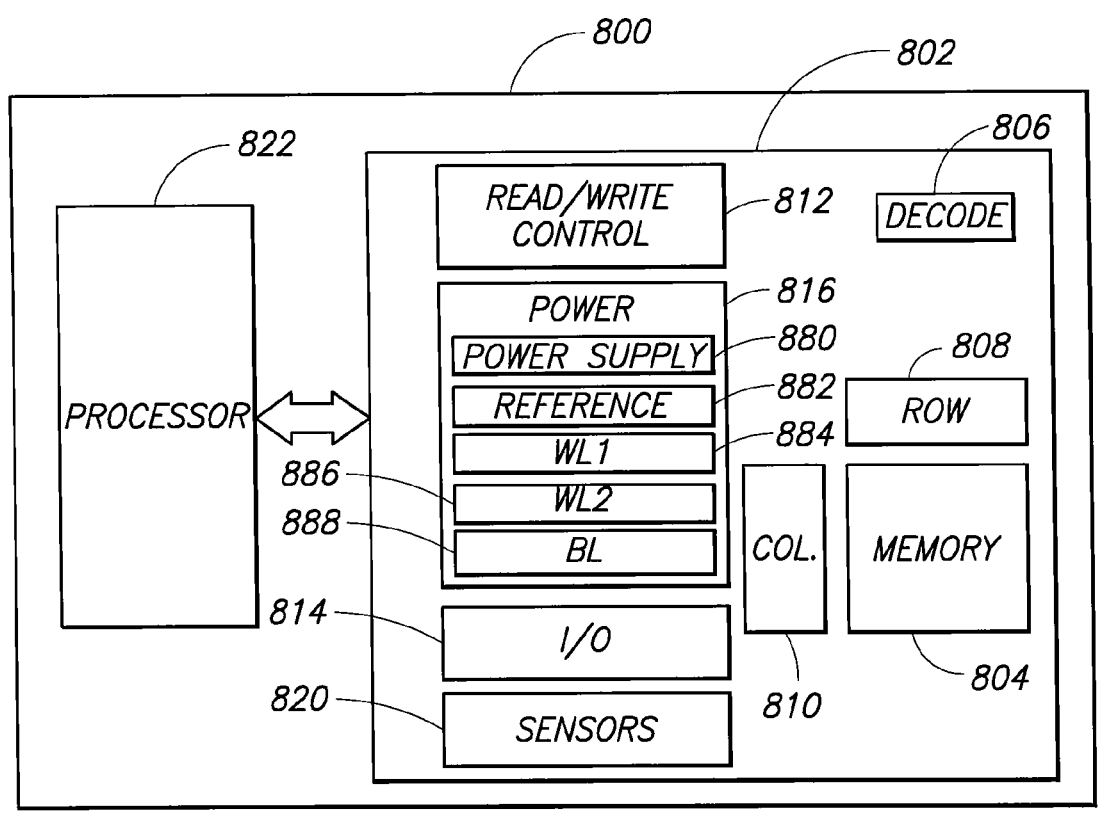

SEMICONDUCTOR BARRIER LAYER CONSTRUCTIONS, AND METHODS OF FORMING SEMICONDUCTOR BARRIER LAYER CONSTRUCTIONS

RELATED PATENT DATA

This patent resulted from a divisional of U.S. patent application Ser. No. 11/167,011 which was filed on Jun. 24, 2005 and which is hereby incorporated by reference.

TECHNICAL FIELD

The invention pertains to semiconductor constructions and to methods of forming semiconductor constructions.

BACKGROUND OF THE INVENTION

It is frequently desired to utilize barrier layers in semiconductor constructions. The barrier layers are provided to impede, and preferably prevent, migration of various materials therethrough. For instance, copper diffusion can be a problem when utilizing copper interconnects, and accordingly barrier materials are provided proximate the copper interconnects to preclude copper diffusion. A common copper-barrier material is tantalum nitride. However, it is difficult to deposit copper directly on tantalum nitride, and accordingly the tantalum nitride will typically be utilized as part of a tantalum nitride/tantalum bi-layer. The tantalum of the bi-layer is provided as a material onto which copper can be readily deposited. The tantalum is utilized in bi-layers with tantalum nitride, rather than alone, because pure tantalum is a poor barrier to copper diffusion. Pure tantalum can contain crystallization-induced columnar textures. Copper can permeate the tantalum along boundaries between adjacent columnar grains.

It is desired to form thinner copper lines as the level of integration increases, and copper barrier materials create numerous difficulties as copper line size decreases. For instance, it is typical to utilize a tantalum nitride/tantalum bi-layer having a thickness of from about 75 Å to about 150 Å, and there are numerous hardware/process control challenges to forming the bi-layer to be less than 50 Å. Thus, the copper diffusion barrier begins to limit the amount by which a copper line can be shrunk. Also, for barrier materials comprising tantalum there can be a challenge in that the columnar tantalum texture can create difficulties in forming the film to be 25 Å or less in thickness.

There have been some attempts to utilize barrier materials other than the tantalum nitride/tantalum bi-layer. For instance, tantalum nitride/ruthenium has been studied as a bi-layer material for utilization with copper. The tantalum nitride is an amorphous material which precludes copper diffusion, and the ruthenium is a seed material for growing the copper. The tantalum nitride/ruthenium bi-layer is utilized instead of a single barrier layer in that the ruthenium lacks suitable barrier properties and the tantalum nitride lacks suitable properties for growing copper thereon. Accordingly, the tantalum nitride is utilized as a barrier to copper diffusion and the ruthenium is utilized to provide a substrate onto which copper can be grown.

A continuing goal in semiconductor device fabrication is to decrease the dimension of circuit elements in order to increase the level of integration. Thus, it is desired to develop new barrier materials suitable for alleviating copper diffusion.

Barrier materials can have other applications besides the above-discussed applications of alleviating copper diffusion. For instance, barrier materials can be utilized to alleviate silicon diffusion, oxygen diffusion, and/or diffusion of numerous other materials.

In some applications, metal-insulator-metal (MIM) capacitors are formed over conductively-doped semiconductor pedestals (such as, for example, conductively-doped silicon pedestals). The electrode of the capacitor closest to the conductively-doped semiconductor pedestal (i.e., the lower electrode) can comprise a noble metal or near noble metal, such as, for example, gold, silver, platinum, palladium, etc. A diffusion barrier material can be provided between the lower capacitor electrode and the conductively-doped semiconductor pedestal in order to alleviate, and preferably prevent, oxygen diffusion from the high-k dielectric through the lower electrode and into the conductively-doped semiconductor. Various materials have been utilized for such barrier material, including, for example, tantalum nitride. However, there can be difficulties associated with the various prior art barrier materials, and it would therefore be desirable to develop new materials which can be utilized for barriers between a capacitor electrode and a conductively-doped semiconductor pedestal.

Persons of ordinary skill in the art will also recognize that there are numerous other applications for barrier materials, including, for example, between conductively-doped diffusion regions and conductive interconnects. It would be desirable to develop new barrier materials that are suitable for utilization in a wide variety of applications.

SUMMARY OF THE INVENTION

In one aspect, the invention includes a semiconductor construction comprising a composition that contains both Ir and Ta. In some embodiments, the composition can be provided between a copper-containing material and an electrically insulative material. In other embodiments, the composition can be provided between a capacitor electrode comprising one or more of gold, silver, palladium and platinum, and a semiconductor material (such as, for example, conductively-doped silicon). In yet other embodiments, the composition can be provided between a conductive interconnect and a conductively-doped diffusion region formed within a monocrystalline semiconductor material. The composition containing Ir and Ta can, in some applications, consist essentially of iridium and tantalum. In such applications, the composition can contain the tantalum to a concentration of from about 40 atomic % to about 70 atomic %, and in exemplary applications will contain the tantalum to a concentration of from about 50 atomic % to about 65 atomic %.

In one aspect, the invention includes a method of forming a semiconductor construction. A semiconductor substrate is provided, and such substrate has an electrically insulative material thereover. A composition containing Ir and Ta is formed over the electrically insulative material, and a copper-containing material is formed over the composition.

In one aspect, the invention includes another method of forming a semiconductor construction. A semiconductor material is provided. A first composition is formed over the semiconductor material, with the first composition comprising Ta and Ir. A second composition is formed over the first composition, with the second composition comprising one or more of gold, silver, palladium, and platinum.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment at a preliminary processing stage of an exemplary aspect of the present invention.

FIG. 2 is a view of the FIG. 1 wafer fragment shown at a processing stage subsequent to that of FIG. 1.

FIG. 5 is a view of the FIG. 1 wafer fragment shown at a processing stage subsequent to that of FIG. 4.

FIG. 6 is a top view of a region of a semiconductor wafer comprising the fragment of FIG. 5. The fragment of FIG. 5 is shown along the line 5-5 of FIG. 6.

FIG. 9 is a diagrammatic, cross-sectional view of a semiconductor wafer fragment shown at a preliminary processing stage of another aspect of the present invention.

FIG. 10 is a view of the FIG. 9 wafer fragment shown at a processing stage subsequent to that of FIG. 9.

FIG. 19 is a view of the FIG. 11 wafer fragment shown at a processing stage subsequent to that of FIG. 18.

FIG. 22 is a view of the FIG. 20 wafer fragment shown at a processing stage subsequent to that of FIG. 21.

FIG. 23 is a view of the FIG. 20 wafer fragment shown at a processing stage subsequent to that of FIG. 20 in accordance with another aspect of the invention.

FIG. 28 is a high level block diagram of an electronic system according to an exemplary aspect of the present invention.

FIG. 29 is a simplified block diagram of an exemplary memory device according to an aspect of the present invention.

DETAILED DESCRIPTION OF THE PREFERRED EMBODIMENTS

Figure 3:
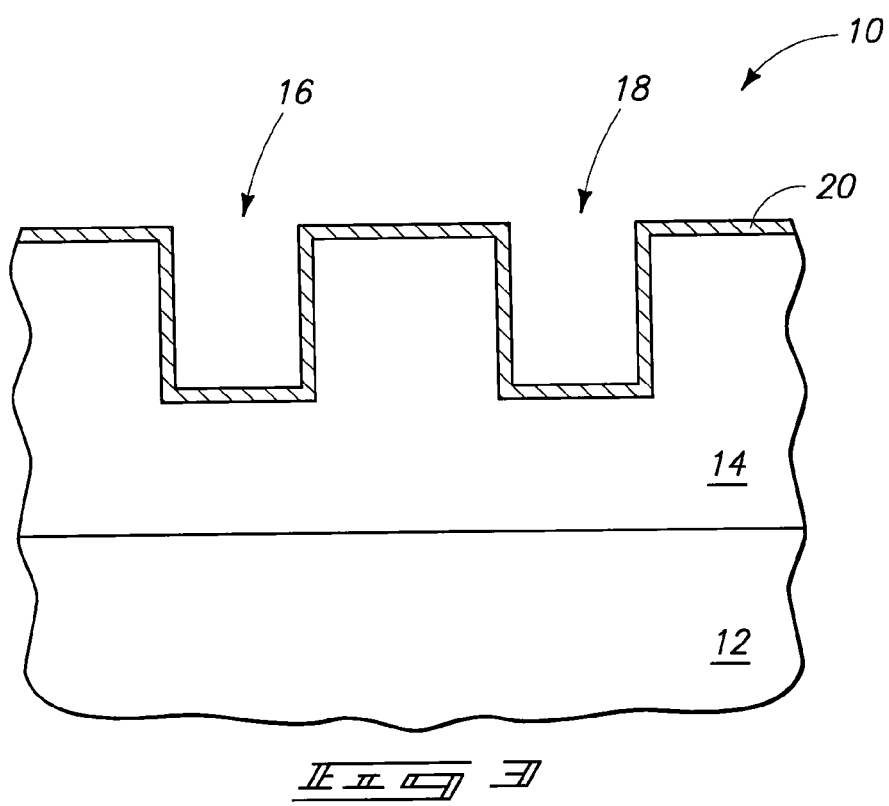
FIG. 3 is a view of the FIG. 1 wafer fragment shown at a processing stage subsequent to that of FIG. 2.

This disclosure of the invention is submitted in furtherance of the constitutional purposes of the U.S. Patent Laws "to promote the progress of science and useful arts" (Article 1, Section 8).

The invention includes methods for utilizing compositions containing iridium and tantalum in semiconductor constructions. In some aspects, a thin layer (for instance, a layer having a thickness of from about 10 Å to about 200 Å, and in exemplary aspects from about 15 Å to about 50 Å) of Ta alloy is provided in amorphous form and utilized as a barrier. The layer can consist essentially of, or consist of iridium and tantalum, and can contain from about 40 atomic % to about 70 atomic % tantalum in some aspects, and in particular aspects can contain from about 50 atomic % to about 65 atomic % tantalum. For instance, the alloy can be $Ir_{45}Ta_{55}$.

The iridium/tantalum material can not only be utilized as a barrier material, but can also be utilized as a substrate for electroplating of a desired metal thereover. For instance, the iridium/tantalum material can be utilized as a substrate for electroplating copper thereover.

The iridium/tantalum material can overcome problems associated with prior art barrier materials, such as, for example, the problems discussed in the "Background" section of this disclosure regarding tantalum nitride/tantalum bi-layers and tantalum nitride/ruthenium bi-layers.

The present invention can comprise a significant departure from conventional bi-layer barrier materials. In some aspects, the present invention utilizes a single material which can have suitable barrier properties, and yet can also provide a substrate to which copper can be adhered. The single material is a composition comprising both iridium and tantalum. Such composition can have amorphous properties which preclude diffusion of copper therethrough, and yet can have suitable properties for electroplating copper directly thereon, or for retaining a copper seed onto which copper is subsequently electroplated. Iridium/tantalum alloys can have very high crystallization temperatures, which can be beneficial since the amorphous forms of the alloys will generally have better barrier properties than the crystalline forms. An exemplary iridium/tantalum alloy is $Ir_{45}Ta_{55}$, which has a crystallization temperature of about 1010° C.

In addition to having desired barrier characteristics, and desired characteristics for allowing electroplating of copper or other metallic materials thereon, iridium/tantalum materials can also have good adhesion to dielectric materials, such as, for example, low-k dielectrics like borophosphosilicate glass (BPSG), phosphosilicate glass (PSG), silicon dioxide, etc.

An exemplary aspect of the invention is described with reference to FIGS. 1-6.

Referring to FIG. 1, a semiconductor wafer construction 10 is illustrated in cross-sectional view. Such construction comprises a semiconductor substrate 12 having an insulative material 14 thereover. Substrate 12 can, for example, comprise, consist essentially of, or consist of monocrystalline silicon lightly-background doped with p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Insulative material 14 can comprise any suitable electrically insulative composition, including, for example, one or more of BPSG, PSG and silicon dioxide.

Referring to FIG. 2, trenches 16 and 18 are formed into insulative material 14. The trenches can be formed with any suitable processing, including, for example, utilization of a photolithographically patterned photoresist mask to define the locations of the trenches, followed by etching into the defined locations to form the trenches and subsequent removal of the photoresist mask.

Referring to FIG. 3, a layer 20 is formed over insulative material 14 and within trenches 16 and 18. Layer 20 can comprise a composition containing iridium and tantalum, and in particular aspects will consist essentially of, or consist of iridium and tantalum. The layer can be formed to a thickness of from about 10 Å to about 200 Å, and in particular aspects will be formed very thin, such as, for example, to a thickness of from about 15 Å to about 50 Å, or even from about 15 Å to about 30 Å. In aspects in which the composition of layer 20 consists essentially of iridium and tantalum, or consists of iridium and tantalum, such composition can contain the tantalum to a concentration of from about 40 atomic % to about 70 atomic %, and in particular aspects can contain the tantalum to a concentration to from about 50 atomic % to about 65 atomic %. For instance, the composition can consist essentially of, or consist of $Ir_{45}Ta_{55}$.

The layer 20 can be formed utilizing any suitable processing, but preferably will have amorphous properties, and accordingly will be formed at a temperature of less than the crystallization temperature of the iridium/tantalum material therein.

Figure 4:
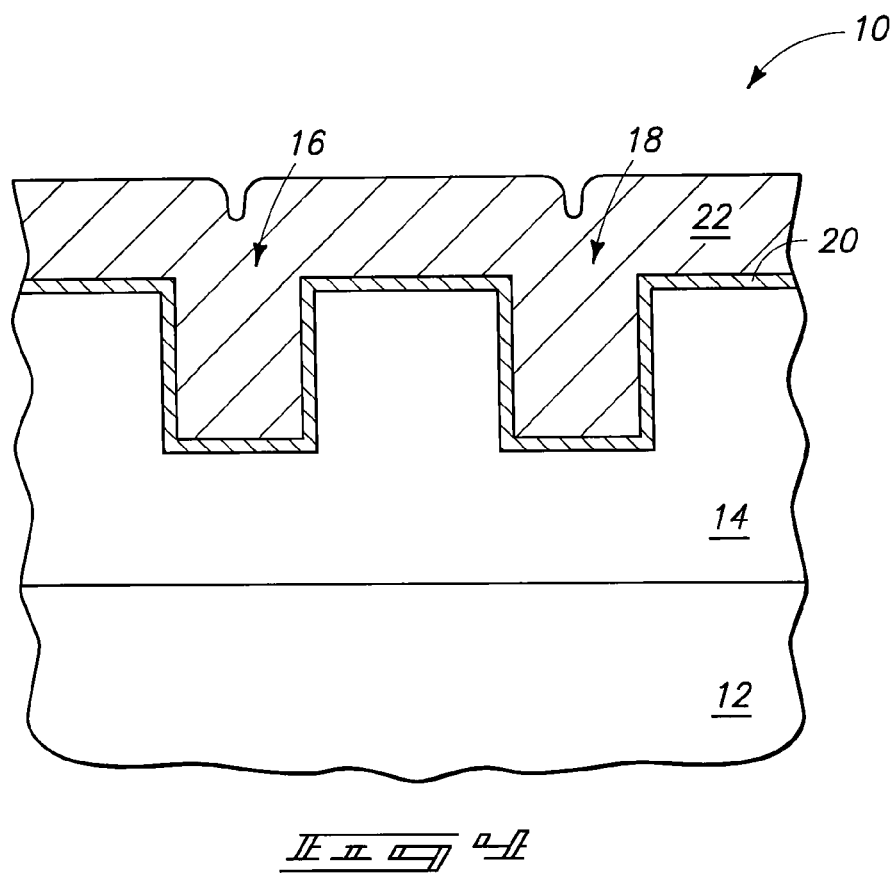
FIG. 4 is a view of the FIG. 1 wafer fragment shown at a processing stage subsequent to that of FIG. 3.

Referring to FIG. 4, a copper-containing material 22 is formed over the layer 20. The copper-containing layer 22 can comprise, consist essentially of, or consist of copper.

Copper-containing material 22 can be formed over layer 20 utilizing any suitable processing. In some aspects, the copper layer 22 can be directly electroplated onto the iridium/tantalum-containing material 20. In other aspects, a copper-containing seed can be first formed over layer 20, and subsequently the layer 22 can be electroplated onto the copper-containing seed.

In the shown aspect of the invention, copper-containing material 22 is provided to completely fill trenches 16 and 18. It is to be understood, however, that the invention encompasses other aspects (not shown) in which the copper-containing material only partially fills the trenches.

The layer 20 can be considered to form a liner which completely lines the peripheries of the trenches, and the copper-containing material 22 can be considered to be formed directly on the liner. In the shown aspect of the invention, copper-containing material 22 is separated from the insulative material by only the liner. Thus, in the shown aspect of the invention the iridium/tantalum-containing composition of layer 20 physically contacts both the copper-containing material 22 and the insulative material 14.

Figure 20:
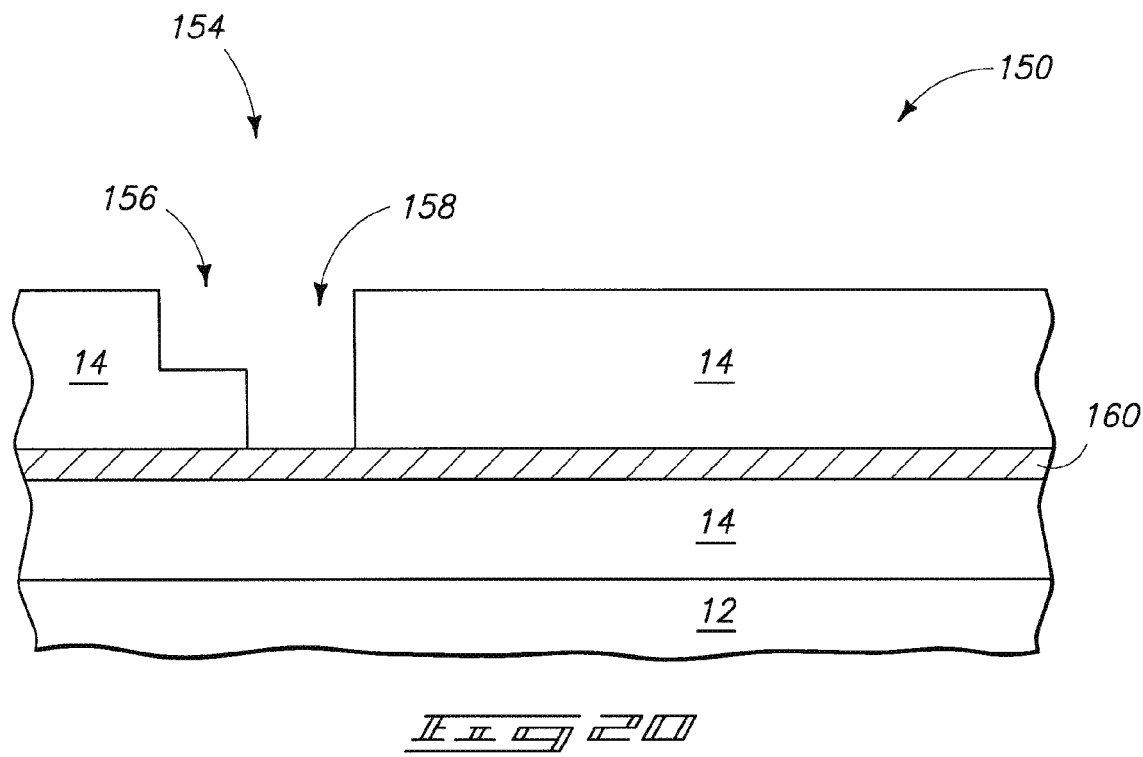
FIG. 20 is a diagrammatic, cross-sectional view of a semiconductor wafer fragment at a preliminary processing stage of another exemplary aspect of the present invention.
Figure 21:
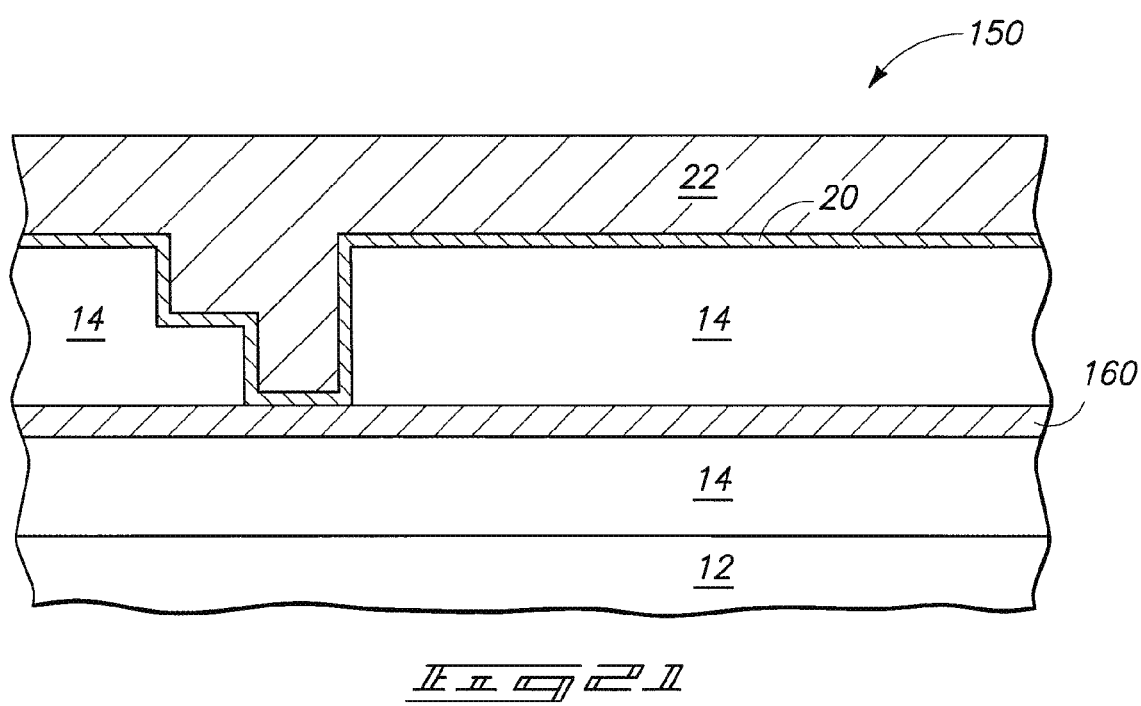
FIG. 21 is a view of the FIG. 20 wafer fragment shown at a processing stage subsequent to that of FIG. 20.

The processing of FIGS. 1-4 can be utilized during formation of any level of metal layer, with various metal layer levels being typically referred to as Metal I, Metal II, Metal III, etc. FIGS. 20 and 21 (discussed below) illustrate a typical Metal I or Metal N (where N is an integer greater than 1) metal level that can be formed in accordance with some aspects of the invention.

Referring to FIG. 5, the fragment 10 is shown at a processing stage subsequent to FIG. 4. Copper-containing material 22 and iridium/tantalum-containing layer 20 are removed from over insulative material 14 by planarization to form a planarized upper surface 23 extending across insulative material 14, layer 20 and material 22. The planarization can comprise, for example, chemical-mechanical polishing. The chemical-mechanical polishing can stop on an uppermost surface of layer 14, or can penetrate partially into layer 14.

One of the physical properties of iridium/tantalum compositions that can be useful in exemplary aspects of the present invention is that the compositions tend to be relatively soft. Thus, the compositions can be relatively easily removed by chemical-mechanical polishing.

FIG. 6 shows a top view of the construction of FIG. 5, and shows that the copper-containing material 22 and barrier layer 20 can form lines extending across a region of the semiconductor substrate. Such lines can be considered a shape of the copper-containing material 22 at the processing stage of FIGS. 5 and 6, and it is to be understood that the material 22 can also be formed in other shapes including, for example, pedestals, pads, etc. for various applications in semiconductor constructions.

The semiconductor construction 10 at the processing stage of FIGS. 5 and 6 can correspond to any suitable level of semiconductor fabrication. Specifically, as is known to persons of ordinary skill in the art, semiconductor fabrication typically involves formation of multiple levels of circuitry over and within a semiconductor substrate. Such levels of circuitry include circuit devices, and include various wiring levels, with the wiring levels frequently being referred to as level I, level II, level III, etc. The structures 12 and 14 of FIGS. 1-6 can have various levels of semiconductor devices (not shown) formed therein, or can be at a preliminary stage of semiconductor fabrication in which no levels of circuitry have yet been formed.

Although the invention described with reference to FIGS. 1-6 has the copper-containing material formed over layer 20 prior to chemical-mechanical polishing of layer 20, it is to be understood that the invention encompasses other aspects in which the chemical-mechanical polishing (or other planarization process) occurs before formation of the copper-containing material. Such aspect is described with reference to FIGS. 7 and 8.

Figure 7:
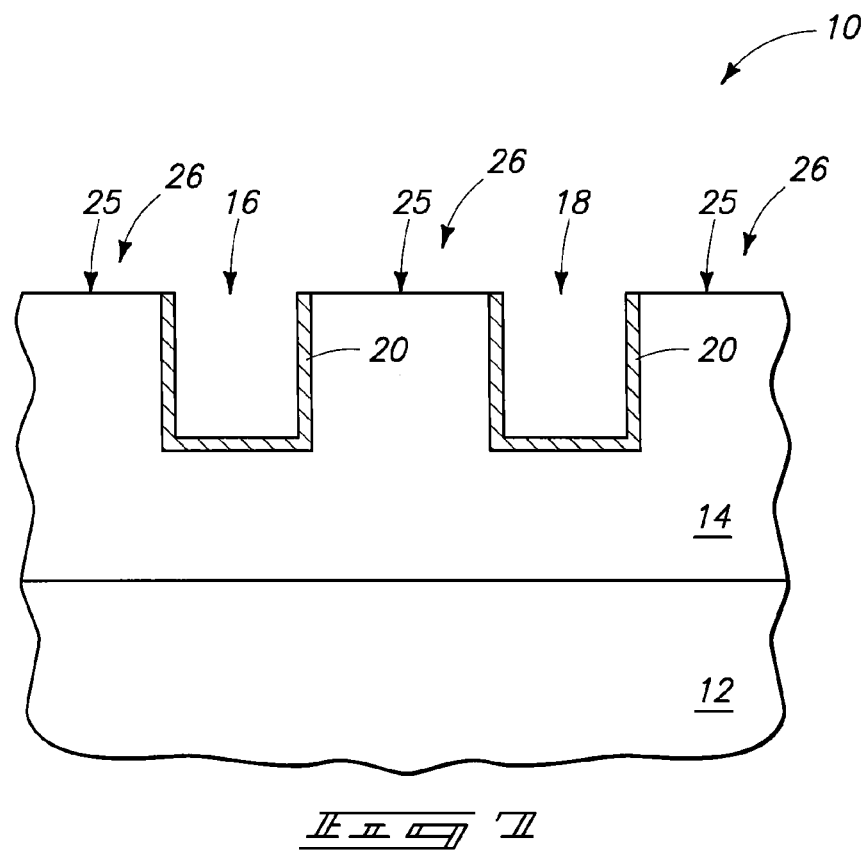
FIG. 7 is a view of the FIG. 1 wafer fragment shown at a processing stage subsequent to that of FIG. 3 in accordance with a second aspect of the invention.

Referring to FIG. 7, construction 10 is shown at a processing stage subsequent to that of FIG. 3, and specifically is shown after chemical-mechanical polishing (or other suitable planarization) has been utilized to remove layer 20 from over insulative material 14 and thereby form a planarized upper surface 25. The insulative material 14 can be considered to comprise segments 26 proximate the trenches 16 and 18, and the planarization can be considered to remove layer 20 from over such segments. In some aspects, the planarization can also remove some of the insulative material 14 associated with the segments, but regardless the planarization has removed layer 20 from over the segments. The shown aspect of the invention forms two trenches and three segments proximate the trenches, but it is to be understood that the invention encompasses other aspects in which other numbers of trenches and segments are formed. Generally, there will be at least one trench, and at least one segment proximate the trench.

Figure 8:
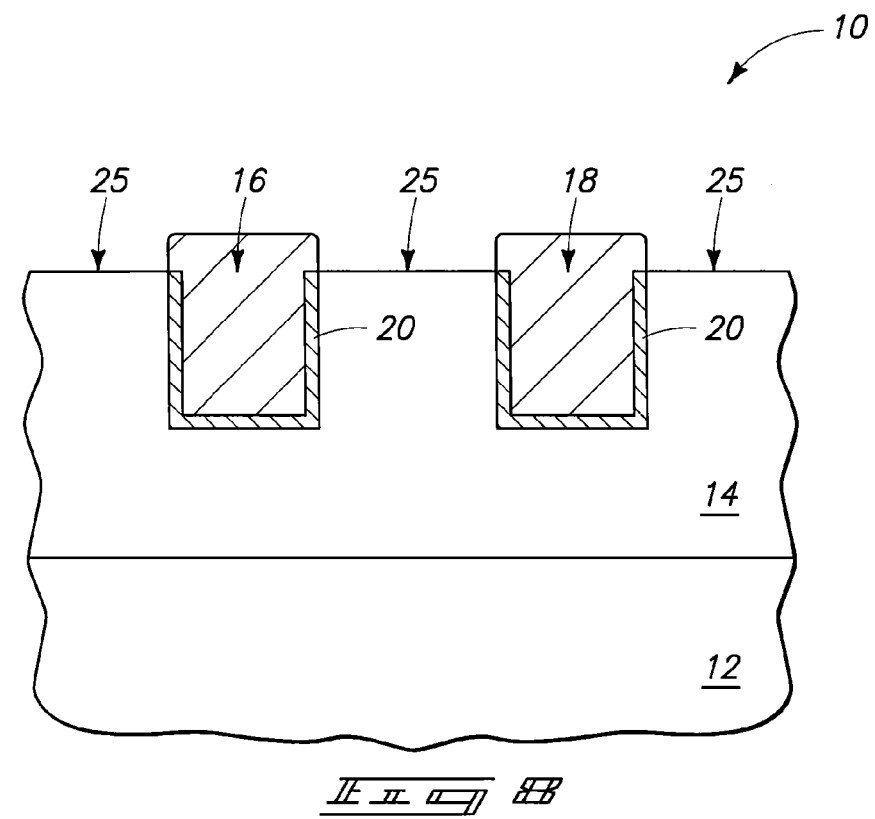
FIG. 8 is a view of the FIG. 1 wafer fragment shown at a processing stage subsequent of that of FIG. 7.

Referring to FIG. 8, copper-containing material 22 is formed within trenches 16 and 18 and over layer 20. The copper-containing material 22 can be formed selectively onto layer 20 by electroplating material 22 onto layer 20; either directly on layer 20, or onto a copper-seed which is provided onto layer 20 prior to the electroplating. Such forms the copper-containing material 22 only within trenches 16 and 18, and not over the segments of insulative material 14 between the trenches. Alternatively, copper-containing material 22 can be formed by other methods which form the copper-containing material 22 both within the trenches and over the insulative material 14 between the trenches, and subsequently the copper-containing material can be patterned to leave the material only within the trenches. Such patterning can be accomplished by planarization of the copper-containing material (for instance, chemical-mechanical polishing), or by any other suitable method.

An advantage of the processing of FIGS. 1-8, relative to prior art processing, is that barrier layer 20 can be used both as a barrier layer and as a substrate for copper growth, and thus can replace the bi-layer constructions traditionally utilized to provide a copper barrier and a substrate for copper growth (for example, the tantalum nitride/tantalum bi-layers or tantalum nitride/ruthenium bi-layers). The barrier layer 20 can be formed to be much thinner than bi-layer constructions, while still achieving the same benefits as are obtained with the bi-layer constructions. Thus, the barrier layer 20 can be more suitable for high levels of integration than the bi-layer constructions.

Another aspect of the invention is described with reference to FIGS. 9 and 10. In referring to FIGS. 9 and 10, similar numbering will be used as was utilized above in describing the aspect of FIGS. 1-8, where appropriate.

Referring to FIG. 9, a semiconductor construction 50 comprises a substrate 12. Such substrate can, for example, comprise, consist essentially of, or consist of monocrystalline silicon lightly-doped with appropriate background-type dopant.

A trenched isolation region 52 extends within the substrate. The trenched isolation region can comprise any suitable electrically insulative composition or combination of compositions, and in particular aspects will comprise, consist essentially of, or consist of silicon dioxide.

A transistor device 54 is supported by substrate 12. The transistor device comprises a transistor gate 56 and a pair of source/drain regions 58 and 60.

The transistor gate 56 comprises a gate dielectric 62, a conductive gate region 64, and an electrically insulative cap 66. The gate dielectric 62 can comprise any suitable composition or combination of compositions, and in particular aspects will comprise, consist essentially of, or consist of silicon dioxide. The conductive gate region 64 can comprise any suitable composition or combination of compositions, and in particular aspects will comprise one or more of various metals, metal compounds, and conductively-doped semiconductor materials (such as, for example, conductively-doped silicon). The insulative cap 66 can comprise any suitable composition or combination of compositions, and in particular aspects will comprise one or both of silicon dioxide and silicon nitride.

Source/drain regions 58 and 60 are conductively-doped diffusion regions extending into substrate 12. For instance, substrate 12 can comprise monocrystalline silicon, and source/drain regions 58 and 60 can comprise p-type doped regions and/or n-type doped regions extending into the monocrystalline silicon.

Sidewall spacers 68 are along opposing sidewalls of gate 56. The sidewall spacers can comprise any suitable composition or combination of compositions, and in particular aspects will comprise one or both of silicon dioxide and silicon nitride.

An electrically insulative material 70 is over substrate 12 and transistor device 54. Insulative material 70 can comprise any suitable composition or combination of compositions, and in particular aspects will comprise one or more of BPSG, PSG and silicon dioxide.

An opening extends through insulative material 70 to source/drain region 60, and a conductive pedestal 72 is within such opening. Conductive pedestal 72 can comprise any suitable composition or combination of compositions, and in particular aspects will comprise one or more of various metals, metal compounds, and conductively-doped semiconductor material (with an exemplary conductively-doped semiconductor material being conductively-doped silicon).

A planar surface 73 extends across pedestal 72 and insulative material 70. Planar surface 73 can be formed by, for example, chemical-mechanical polishing.

Referring to FIG. 10, a barrier layer 80 is formed over surface 73. Barrier layer 80 can comprise iridium and tantalum, and can have identical compositions and thicknesses as the layer 20 discussed above with reference to FIG. 3.

A capacitor stack 82 is formed over layer 80. The capacitor stack comprises a first capacitor electrode 84, a dielectric material 86, and a second capacitor electrode 88. The first and second capacitor electrodes can comprise any suitable electrically conductive material or combination of materials, including, for example, various metals, metal compositions, and conductively-doped semiconductor materials. The capacitor stack can be considered to have a first composition 84, second composition 86, and third composition 88; with the first and third compositions being capacitively coupled to one another.

In particular aspects, the capacitor construction 82 will correspond to a metal-insulator-metal construction, and accordingly electrodes 84 and 88 will comprise various metals. Such metals can be noble metals or near noble metals, and in particular aspects can comprise, consist essentially of, or consist of one or more of gold, silver, platinum, and palladium. Thus, both of the electrodes 84 and 88 can consist essentially of, or consist of platinum or palladium.

The dielectric material 86 can be any suitable composition or combination of compositions, and in particular aspects can comprise, consist essentially of, or consist of one or more of silicon dioxide, silicon nitride, and various high-k dielectric materials (such as, for example, tantalum oxide and aluminum oxide).

The composition 80 comprising tantalum and iridium separates the capacitor construction 82 from the conductively-doped semiconductor material of pedestal 72. In the shown aspect of the invention, the lower electrode 84 is directly against the layer 80 comprising tantalum and iridium, and the pedestal 72 is also directly against the layer 80 comprising tantalum and iridium. In exemplary aspects of the invention, the dielectric 86 can comprise a substance that can migrate through lower electrode 84, and which is blocked by layer 80 from reaching materials underlying electrode 84. For instance, dielectric material 86 can comprise tantalum pentoxide, lower electrode 84 can comprise platinum, and pedestal 72 can comprise conductively-doped semiconductor material. In such aspects, oxygen from the tantalum pentoxide can migrate through the platinum of layer 84. However, the iridium/tantalum composition of layer 80 can be a barrier to prevent such oxygen from reaching the conductively-doped semiconductor material of pedestal 72. Thus, the tantalum/iridium composition of layer 80 can function as a barrier to prevent migration of materials from capacitor construction 82 into conductively-doped semiconductor material (such as, for example, conductively-doped silicon) of pedestal 72.

An advantage of using iridium/tantalum of layer 80 as a barrier can be that the electrode 84 can be electroplated onto material 80. Another advantage of utilizing the iridium/tantalum material as a barrier is that such can provide a thinner barrier material than prior art barrier materials.

The transistor 54 and capacitor stack 82 can together form a dynamic random access memory (DRAM) unit cell. The source/drain region 58 can be connected to a bitline 90 in some aspects of the invention so that the DRAM unit cell can be incorporated into a DRAM array.

Capacitor constructions formed utilizing methodology of the present invention can have numerous geometries, including, for example, the planar geometry of FIG. 10, a pedestal configuration, or a container capacitor geometry of the type discussed below with reference to FIG. 22.

Additional aspects of the invention are discussed with reference to FIGS. 11-19. In referring to FIGS. 11-19, similar number will be used as was utilized above in describing the aspects of FIGS. 1-6, where appropriate.

Figure 11:
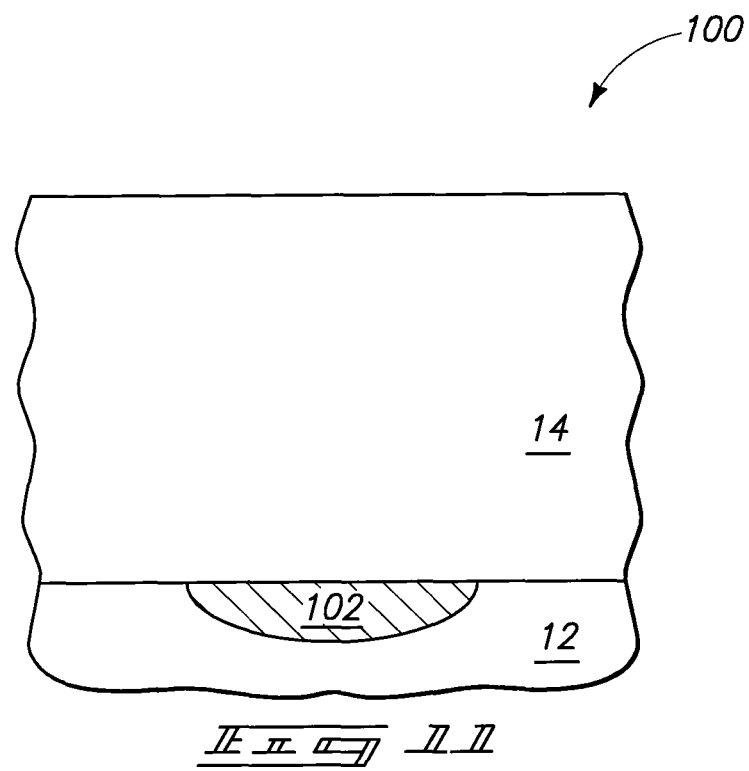
FIG. 11 is a diagrammatic, cross-sectional view of a semiconductor wafer fragment shown at a preliminary processing stage of yet another aspect of the present invention.

Referring initially to FIG. 11, a semiconductor construction 100 is illustrated at a preliminary processing stage. The construction 100 comprises a substrate 12 having an insulative material 14 thereover. The construction also comprises a conductively-doped diffusion region 102 extending into substrate 12. The conductively-doped diffusion region is an exemplary conductive node, and it is to be understood that other conductive nodes can be provided, with other exemplary conductive nodes being metal-containing materials.

Figure 12:
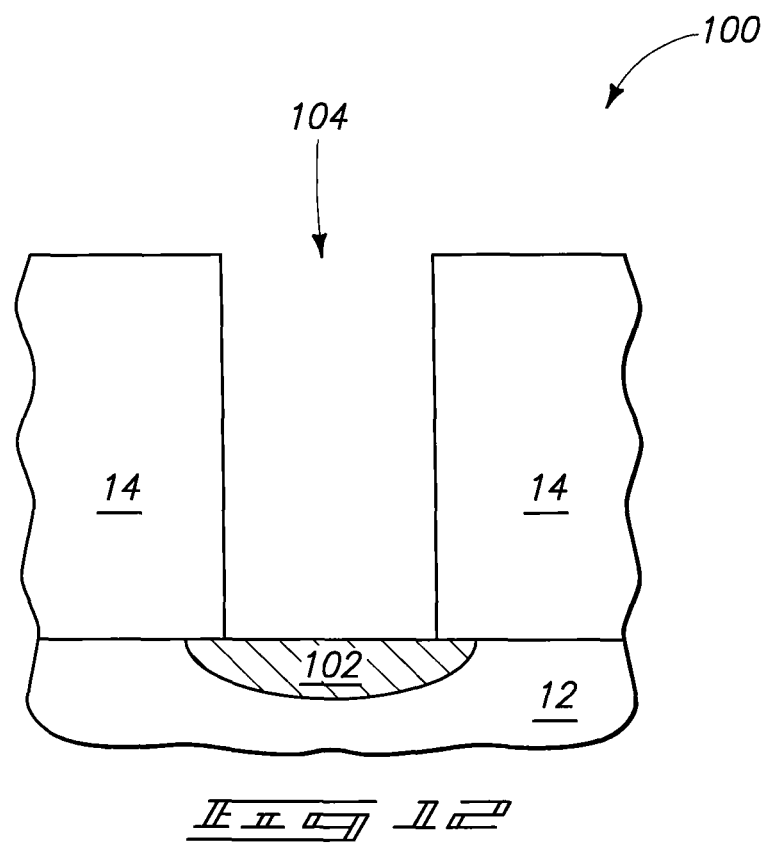
FIG. 12 is a view of the FIG. 11 wafer fragment shown at a processing stage subsequent to that of FIG. 11.

Referring to FIG. 12, an opening 104 is formed to extend through insulative material 14 and to the diffusion region 102. The opening can be formed by any suitable processing, including, for example, formation of a photolithographically patterned photoresist mask over insulative material 14 to define the location of the opening, an etch through material 14 to form the opening, and subsequent removal of the photoresist mask.

Figure 13:
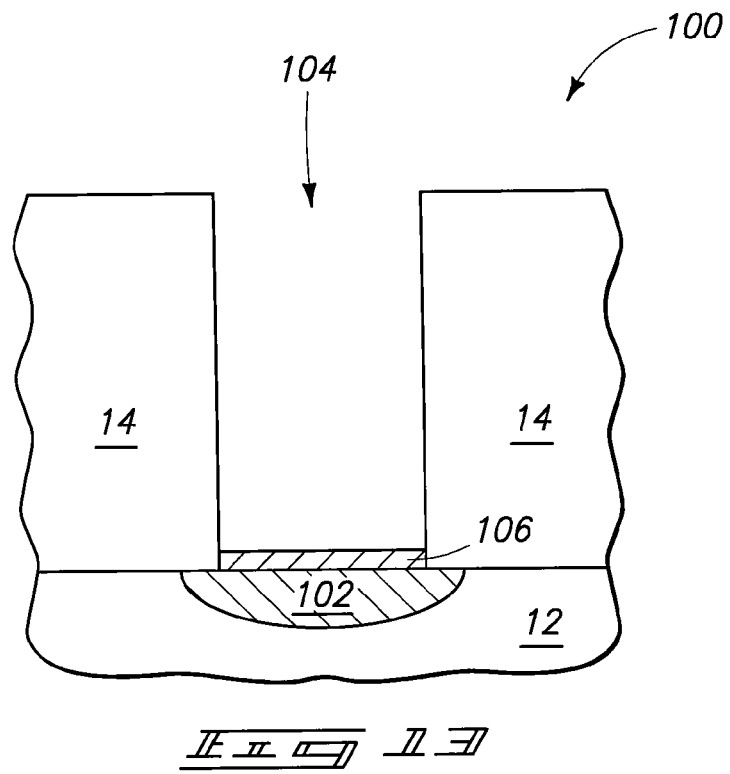
FIG. 13 is a view of the FIG. 11 wafer fragment shown at a processing stage subsequent to that of FIG. 12.

Referring to FIG. 13, a layer 106 is formed along the bottom of opening 104. The layer 106 can comprise, consist essentially of, or consist of Ir/Ta, and can have a thickness and composition identical to the thicknesses and compositions discussed above for layer 20 of FIG. 3.

Figure 14:
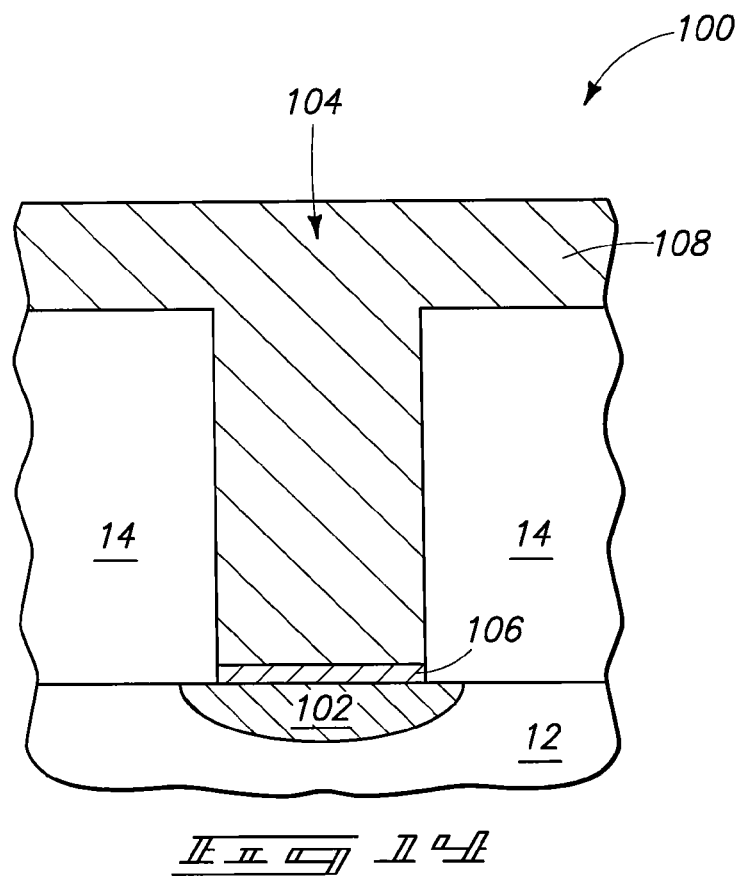
FIG. 14 is a view of the FIG. 11 wafer fragment shown at a processing stage subsequent to that of FIG. 13.

Referring to FIG. 14, opening 104 is filled with conductive material 108. Conductive material 108 can comprise, consist essentially of, or consist of conductively-doped semiconductor material, various metals and/or various metal compositions. Exemplary metals that can be utilized in material 108 are copper, noble metals and near noble metals; with exemplary noble metals and near noble metals including gold, silver, platinum and palladium. The material 108 can be referred to as a second composition to distinguish such material from the first composition of layer 106. In the shown aspect of the invention, the conductive material 108 directly contacts an uppermost surface of layer 106, and layer 106 directly contacts an uppermost surface of substrate 12. In particular aspects, substrate 12 can comprise, consist essentially of, or consist of monocrystalline silicon, and the layer 106 comprising tantalum/iridium can thus be in direct physical contact with such monocrystalline silicon. Also, the layer 106 can be in direct physical contact with material 108.

The conductive material 108 can ultimately be formed into a conductive pedestal contained within opening 104 by, for example, chemical-mechanical polishing to remove layer 108 from over insulative material 104 while leaving the material 108 within the opening 104. Although the conductive material 108 is shown entirely filling opening 104, it is to be understood that the invention encompasses other aspects in which material 108 only partially fills opening 104.

Figure 15:
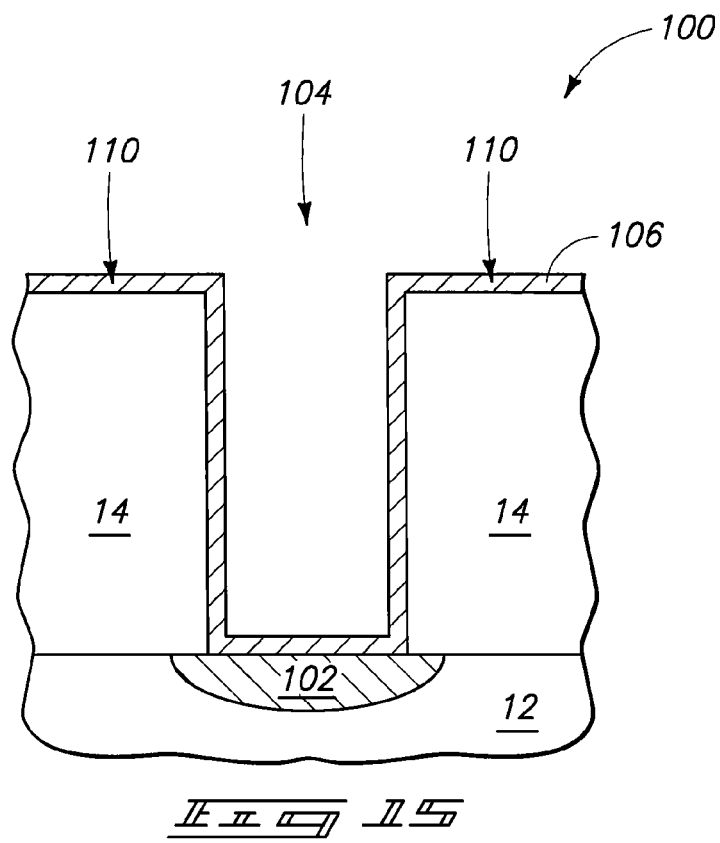
FIG. 15 is a view of the FIG. 11 wafer fragment shown at a processing stage subsequent to that of FIG. 12 in accordance with yet another aspect of the present invention.

Referring next to FIG. 15, such shows construction 100 at a processing stage subsequent to FIG. 12 in accordance with another aspect of the invention. Specifically, the layer 106 is shown to extend over an uppermost surface of insulative material 14, as well as within opening 104 and along sidewalls of the opening. The construction of FIG. 16 can be considered to comprise segments 110 of insulative material 14 proximate opening 104, and to comprise Ir/Ta-containing layer 106 extending over such segments.

Figure 16:
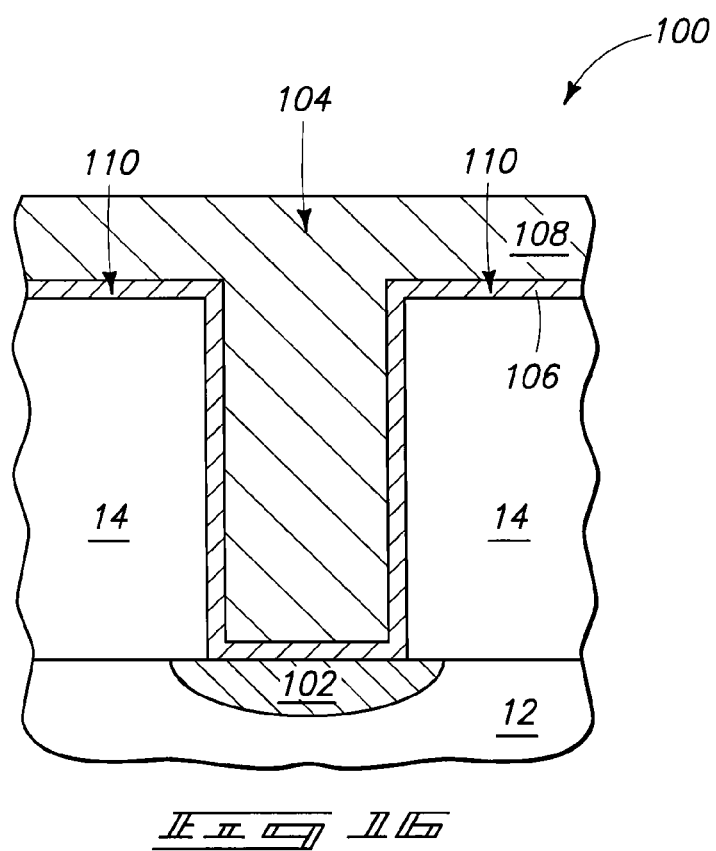
FIG. 16 is a view of the FIG. 11 wafer fragment shown at a processing stage subsequent to that of FIG. 15.

Referring to FIG. 16, construction 100 is shown at a processing stage subsequent to FIG. 15. Conductive material 108 has been formed over layer 106 and within opening 104 to fill the remainder of the opening. The conductive 108 also extends over segments 110 of material 14.

Figure 17:
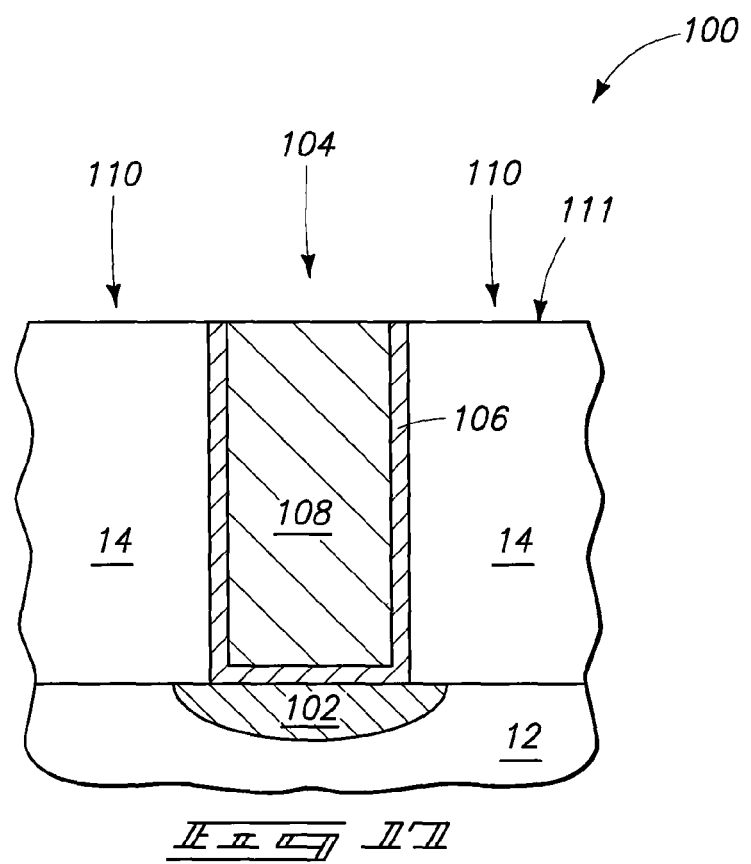
FIG. 17 is a view of the FIG. 11 wafer fragment shown at a processing stage subsequent to that of FIG. 16.

FIG. 17 shows a processing stage subsequent to FIG. 16. Materials 106 and 108 have been subjected to planarization (such as, for example, chemical-mechanical polishing) to remove materials 106 and 108 from over segments 110 of insulative material 14, and to thereby form a planarized upper surface 111. The materials 106 and 108 thus form a conductive interconnect extending upwardly from diffusion region 102 to the upper surface 111.

Figure 18:
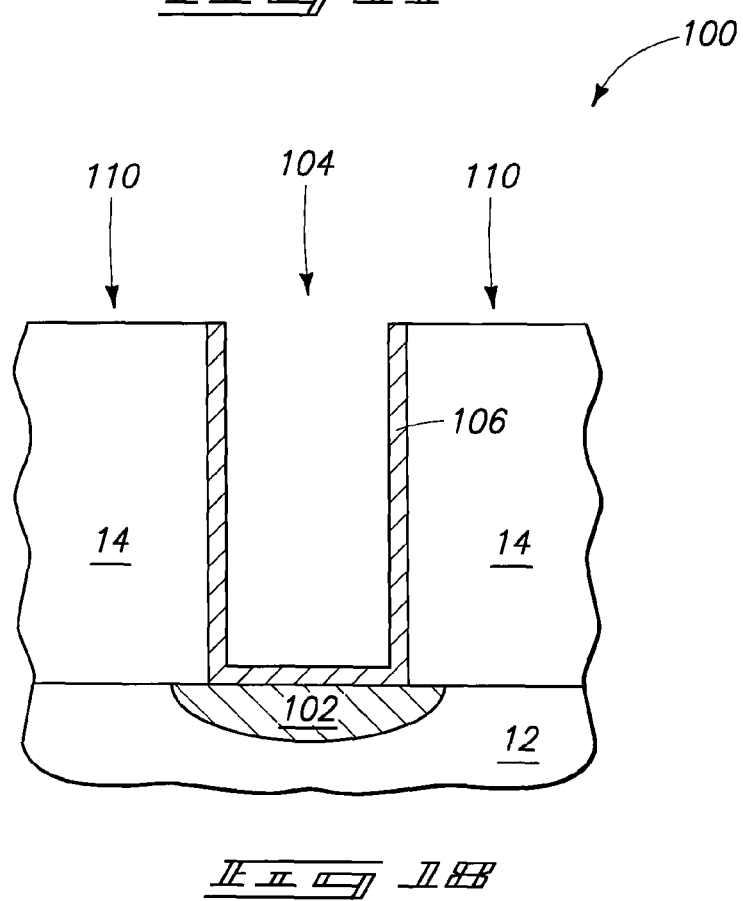
FIG. 18 is a view of the FIG. 11 wafer fragment shown at a processing stage subsequent to that of FIG. 15 in accordance with yet another aspect of the present invention.

Referring next to FIG. 18, such shows construction 100 at a processing stage subsequent to that of FIG. 15 in accordance with another aspect of the invention. Specifically, the material 106 has been removed from over segments 110, but left within opening 104. Such removal can be accomplished by, for example, chemical-mechanical polishing.

Referring next to FIG. 19, conductive material 108 is selectively formed on material 106 relative to insulative material 14. Such can be accomplished by, for example, electroplating material 108 onto conductive material 106. For instance, if material 106 consists essentially of, or consists of tantalum/iridium, conductive material 108 can comprise any metal which can be electroplated onto material 106; which can include, for example, one or more of copper, platinum, palladium, gold and silver in various aspects of the invention. The conductive material 108 forms a conductive interconnect which can subsequently be utilized for connecting electrically conductive circuitry (not shown) with diffusion region 102.

FIGS. 20-24 show exemplary metal interconnects which can be formed in accordance with aspects of the present invention. The numbering utilized in FIGS. 20-24 is identical to that used in FIG. 4, where appropriate.

FIG. 20 shows a structure 150 comprising a metal layer 160 extending within insulative material 14. The metal layer can correspond to any metal level, including, for example, a Metal I level, a Metal II level, a Metal III, level, etc.; and can be generally referred to as a Metal N level, where "N" is an integer. The metal layer 160 can comprise any suitable metal, and in some aspects can comprise, consist essentially of, or consist of copper. In such aspects, the layer can be formed against a Ta/Ir barrier material (not shown) of the type described previously in this disclosure.

An opening 154 extends through material 14 and to an upper surface of metal layer 160. The opening comprises a trench 156 extending in a direction orthogonal to the cross-sectional view of FIG. 20, and a via 158 extending through the trench and connecting to layer 160. The opening 154 is a typical opening utilized for damascene fabrication of metal layers associated with integrated circuitry, as will be recognized by persons of ordinary skill in the art.

Referring to FIG. 21, the Ta/Ir material 20 discussed previously is formed over an upper surface of material 14 and within opening 154; and copper-containing material 22 is formed over material 20. The processing utilized to form materials 20 and 22 can be identical to methods discussed previously in this disclosure.

Referring to FIG. 22, materials 20 and 22 are polished from over the uppermost surface of material 14, and left within opening 154. The polishing can correspond to, for example, chemical-mechanical polishing. The materials 20 and 22 within the trench 156 of opening 154 form a metal line extending orthogonally to the line 160. The line 160 can be a metal line at a level "N", and the line formed within trench 156 can be at the level "N+1".

The structure of FIG. 22 has Ta/Ir material 20 at the interface between material 22 and the conductive material of line 160. In some aspects, it can be desired for the conductive material 22 to directly contact the conductive material of line 160. In such aspects, it can be desired to remove material 22 from the bottom of via 158 prior to forming material 22 within the via. FIG. 23 shows construction 150 at a processing stage subsequent to that of FIG. 20, and shows material 20 formed within opening 154 and removed from the bottom of via 158. Such removal can be accomplished by protecting portions of material 20 that are not at the bottom of via 158 with a protective mask (not shown), and then subjecting the material 20 at the bottom of via 158 to any suitable etch which removes the material 20. The protective mask can then be removed to leave the structure of FIG. 23. Alternatively, the structure of FIG. 23 can be formed by depositing material 20 in a manner which forms the material within trench 156, but not along the bottom of via 158. Another exemplary method of forming a structure having the FIG. 23 exposed material 160 at the bottom of via 158 is to use an in situ sputter etch (using for example, metal ions or argon ions), post deposition of the material 20. The sputter etch can clear the material 20 from the bottom of the via while leaving the material along the sidewalls of the via 158 and trench 156, and can be conducted without utilization of a protective mask.

Figure 24:
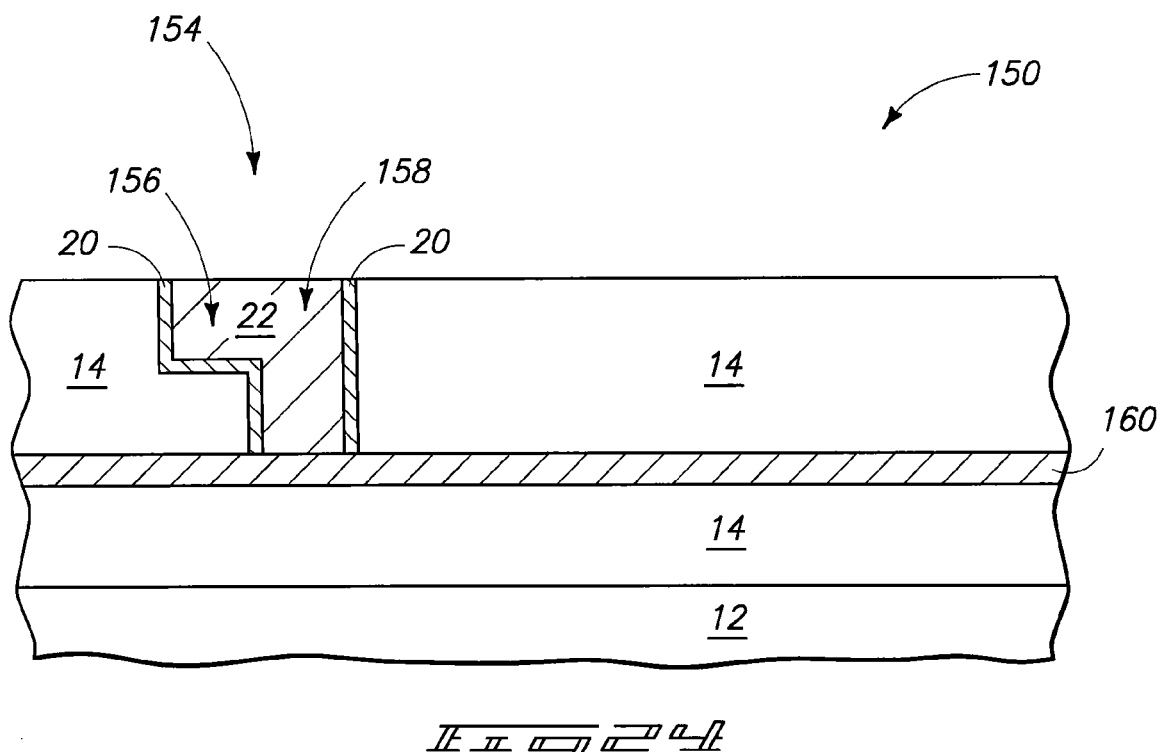
FIG. 24 is a view of the FIG. 20 wafer fragment shown at a processing stage subsequent to that of FIG. 23.

Referring to FIG. 24, construction 150 is shown after material 22 is provided within opening 154, and after polishing to remove materials 20 and 22 from over an uppermost surface material 14 (in other words, after processing analogous to that discussed above with reference to FIGS. 21 and 22). The construction of FIG. 24 has copper-containing material 22 directly contacting the conductive material of line 160.

Figure 25:
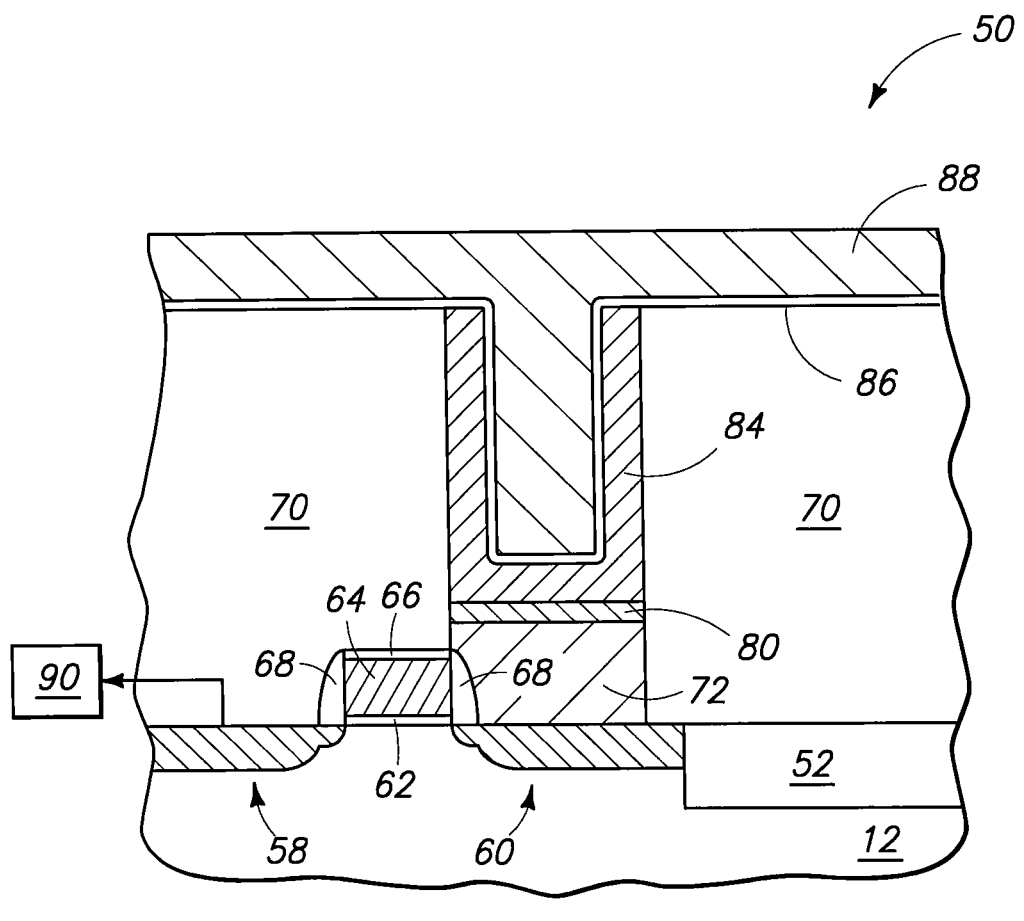
FIG. 25 is a diagrammatic, cross-sectional view of a semiconductor wafer fragment illustrating an exemplary aspect of the present invention.

FIG. 25 shows an exemplary container-type metal-insulator-metal capacitor which can be formed in accordance with aspects of the present invention. The capacitor is shown electrically connected with a transistor, and thus incorporated into a DRAM unit cell. The numbering utilized in FIG. 25 is identical to that utilized in FIG. 10.

Figure 26:
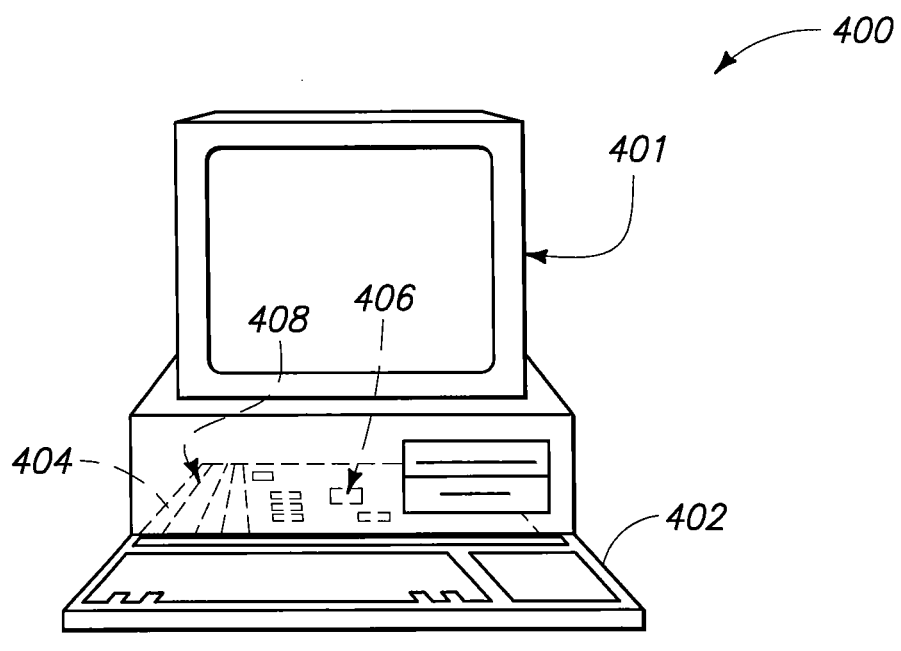
FIG. 26 is a diagrammatic view of a computer illustrating an exemplary application of the present invention.
Figure 27:
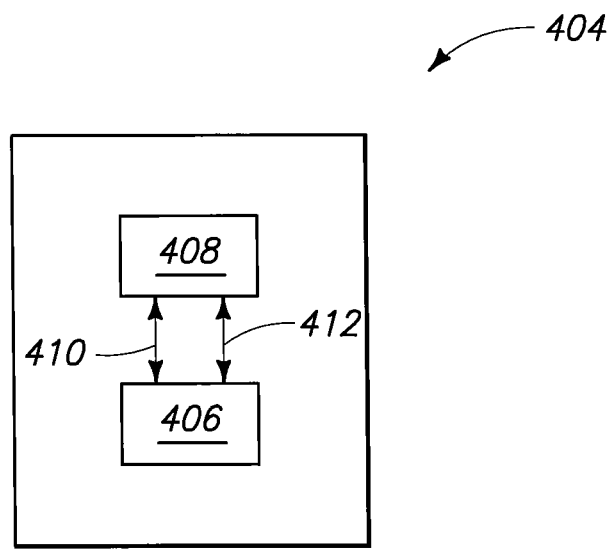
FIG. 27 is a block diagram showing particular features of the motherboard of the FIG. 26 computer.

The various devices described above can be utilized in numerous systems. For instance, FIG. 26 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM unit cell of FIG. 10 and/or that of FIG. 25. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 27. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention described above with reference to FIGS. 1-22.

FIG. 28 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

FIG. 29 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells and other structures of the present invention can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
    a conductively doped silicon-comprising semiconductor material;
    an insulative material directly on and in physical contact with the conductively doped silicon-comprising semiconductor material, the insulative material comprising one of borophosphosilicate glass and phosphosilicate glass;
    a first composition containing Ir and Ta over the conductively doped silicon-comprising semiconductor material and in contact with the insulative material; and
    a second composition over the first composition and comprising one or more of gold, silver, palladium and platinum.

2. The construction of claim 1 wherein the first composition consists essentially of Ir and Ta.

3. The construction of claim 1 wherein the first composition contains the tantalum to a concentration of from about 40 atomic percent to about 70 atomic percent.

4. The construction of claim 1 wherein the first composition contains the tantalum to a concentration of from about 50 atomic percent to about 65 atomic percent.

5. The construction of claim 1 wherein the first composition consists essentially of Ir and Ta; and wherein the first composition directly contacts both the conductively doped silicon-comprising semiconductor material and the second composition.

6. The construction of claim 5 wherein the second composition is part of a capacitor electrode, and wherein the conductively doped silicon-comprising semiconductor material consists essentially of conductively-doped silicon.

7. The construction of claim 5 wherein the conductively doped silicon-comprising semiconductor material is monocrystalline silicon, and further comprising an electrically insulative material over the monocrystalline silicon and having an opening extending therethrough to the monocrystalline silicon; wherein the first composition is along a bottom of the opening; and wherein the second composition is within the opening and over the first composition.

8. The construction of claim 7 wherein the second composition fills the opening over the first composition.

9. A method of forming a semiconductor construction, comprising:
    providing a conductively doped silicon-comprising semiconductor material;
    forming an electrically insulative material selected from borophosphosilicate glass and phosphosilicate glass directly on and in physical contact with the conductively doped silicon-comprising semiconductor material;
    forming a first composition over the conductively doped silicon-comprising semiconductor material, the first composition comprising Ta and Ir and contacting the electrically insulative material; and
    forming a second composition over the first composition, the second composition comprising one or more of gold, silver, palladium and platinum.

10. The method of claim 9 wherein the first composition consists essentially of Ir and Ta.

11. The method of claim 10 wherein the first composition contains the tantalum to a concentration of from about 40 atomic percent to about 70 atomic percent.

12. The method of claim 10 wherein the first composition contains the tantalum to a concentration of from about 50 atomic percent to about 65 atomic percent.

13. The method of claim 10 wherein:
    the first composition consists essentially of Ir and Ta;
    the first composition is formed directly on the conductively doped silicon-comprising semiconductor material; and
    the second composition is formed directly on the first composition.

14. The method of claim 13 wherein the conductively doped silicon-comprising semiconductor material consists essentially of conductively-doped silicon; wherein the second composition is electrically conductive; and further comprising:
    forming a dielectric material over the second composition; and
    forming a third composition over the dielectric material, the third composition being electrically conductive and being capacitively coupled with the second composition.

15. The method of claim 13 wherein the semiconductor material is monocrystalline silicon, and further comprising:
   forming an opening through the electrically insulative material to the monocrystalline silicon;
   wherein the forming said first composition includes forming the first composition along a bottom of the opening; and
   wherein the forming said second composition includes forming the second composition within the opening and over the first composition.

16. The method of claim 15 wherein the first composition is initially formed within the opening and over a segment of the electrically insulative material proximate the opening; and wherein the first composition is subsequently removed from over the segment by chemical-mechanical polishing.

17. The method of claim 16 wherein the first composition is removed from over the segment after the formation of the second composition.

18. The method of claim 16 wherein the first composition is removed from over the segment prior to the formation of the second composition.

\* \* \* \* \*

UNITED STATES PATENT AND TRADEMARK OFFICE
CERTIFICATE OF CORRECTION

PATENT NO.           : 8,659,064 B2                                          Page 1 of 1
APPLICATION NO.      : 13/185872
DATED                : February 25, 2014
INVENTOR(S)          : Yongjun Jeff Hu It is certified that error appears in the above-identified patent and that said Letters Patent is hereby corrected as shown below:

On the Title page, in item (56), under "U.S. Patent Documents", in column 2 , line 4, delete "Pan et al." and insert -- Hu et al. --, therefor.

On the Title page, in item (56), under "Other Publications", in column 2, line 1, delete "Worls" and insert -- World --, therefor.

On the Title page, in item (56), under "Other Publications", in column 2, line 3, delete "Worts" and insert -- World --, therefor.

Signed and Sealed this
Twenty-ninth Day of July, 2014

Michelle K. Lee
*Deputy Director of the United States Patent and Trademark Office*